(12) United States Patent
Tang

(10) Patent No.: US 12,490,421 B2
(45) Date of Patent: Dec. 2, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 622 days.

(21) Appl. No.: 17/816,785

(22) Filed: Aug. 2, 2022

(65) Prior Publication Data
US 2023/0413513 A1 Dec. 21, 2023

(30) Foreign Application Priority Data
Jun. 10, 2022 (CN) .......................... 202210657519.1

(51) Int. Cl.
*H10B 12/00* (2023.01)
(52) U.S. Cl.
CPC ............. *H10B 12/30* (2023.02); *H10B 12/05* (2023.02); *H10B 12/488* (2023.02)
(58) Field of Classification Search
CPC ....... H10B 12/30; H10B 12/05; H10B 12/488
See application file for complete search history.

(56) References Cited

U.S. PATENT DOCUMENTS

| | | | |
|---|---|---|---|
| 10,256,252 B1 * | 4/2019 | Kanazawa | .......... H01L 21/0217 |
| 2020/0286901 A1 * | 9/2020 | Shimomura | ........... H10B 41/27 |
| 2021/0375926 A1 | 12/2021 | Mehandru et al. | |
| 2022/0102273 A1 * | 3/2022 | Kubo | ................ H01L 21/76816 |
| 2022/0122976 A1 * | 4/2022 | Kim | ..................... H10B 12/482 |
| 2022/0181270 A1 * | 6/2022 | Ong | ................. H01L 21/76816 |
| 2023/0044232 A1 * | 2/2023 | Kai | ........................ H10B 41/27 |

FOREIGN PATENT DOCUMENTS

EP 3826058 A1 5/2021

* cited by examiner

*Primary Examiner* — Peter Bradford
*Assistant Examiner* — Ryan T. Fortin
(74) *Attorney, Agent, or Firm* — Kilpatrick Townsend & Stockton LLP

(57) ABSTRACT

The semiconductor structure includes a transistor region and a step region, the transistor region includes a word line region, the word line region directly faces and is connected to the step region, and the manufacturing method includes: providing a base and forming sacrificial layers and active layers on the base; forming first isolation layers in the transistor region, wherein the first isolation layers divide a part of the active layers into a plurality of active structures; removing a part of the first isolation layers and a part of the sacrificial layers in the word line region; forming word lines and dielectric layers in the word line region, wherein the step region includes a first region and second regions located on two sides of the first region.

9 Claims, 16 Drawing Sheets

METHOD OF MANUFACTURING SEMICONDUCTOR STRUCTURE AND SEMICONDUCTOR STRUCTURE

CROSS-REFERENCE TO RELATED APPLICATIONS

This application claims the priority of Chinese Patent Application No. 202210657519.1, submitted to the Chinese Intellectual Property Office on Jun. 10, 2022, the disclosure of which is incorporated herein in its entirety by reference.

TECHNICAL FIELD

The present disclosure belongs to the field of semiconductors, and in particular, relates to a method of manufacturing a semiconductor structure and a semiconductor structure.

BACKGROUND

A dynamic random access memory (DRAM) is a semiconductor memory that operates mainly according to a principle of using a quantity of charges stored in a capacitor to represent whether a binary bit stored therein is 1 or 0.

A 3D stacked DRAM has a structure in which a plurality of layers of transistors are stacked on a base, and is highly integrated and helps reduce costs per unit area. However, a yield of the 3D stacked DRAM is still to be improved.

SUMMARY

According to some embodiments of the present disclosure, one aspect of the embodiments of the present disclosure provides a method of manufacturing a semiconductor structure, wherein the semiconductor structure includes a transistor region and a step region arranged in a first direction, the transistor region includes a word line region, the word line region directly faces and is connected to the step region, and the manufacturing method includes: providing a base, and forming sacrificial layers and active layers that are alternately arranged on the base; forming a plurality of first isolation layers extending along a second direction in the transistor region, wherein the second direction is perpendicular to the first direction, each of the first isolation layers is located in the sacrificial layers and the active layers, and the first isolation layers divide a part of the active layers into a plurality of active structures; removing a part of the first isolation layers in the word line region and a part of the sacrificial layers in the word line region; forming a plurality of word lines in the word line region and forming a plurality of dielectric layers in the word line region, wherein each of the dielectric layers is located on a part of surfaces of a plurality of the active structures, each of the word lines is located on a surface of a corresponding dielectric layer, each of the word lines extends along the first direction, the step region includes a first region and second regions located on two sides of the first region, and the first region extends along the second direction; removing a part of the sacrificial layers in the first region; performing a first conductorization on a part of the active layers in the first region; forming a support structure wrapping the part of the active layers in the first region after the first conductorization; removing a part of the sacrificial layers in the second regions after the forming a support structure; and performing a second conductorization on a part of the active layers in the second regions, such that a part of the active layers in the step region are electrically connected to the word lines.

According to some embodiments of the present disclosure, another aspect of the embodiments of the present disclosure further provides a semiconductor structure, including a transistor region and a step region arranged in a first direction, wherein the transistor region further includes a word line region, and the word line region directly faces and is connected to the step region; and the semiconductor structure includes: a base, wherein a plurality of active layers that are arranged at intervals are provided on the base; wherein the transistor region includes a plurality of first isolation layers that are arranged at intervals, for dividing a part of the active layers into a plurality of active structures, each of the active structures extends along a second direction, and the second direction is perpendicular to the first direction; the word line region includes word lines and dielectric layers, each of the dielectric layers is located on a part of surfaces of a plurality of the active structures, each of the word lines is located on a surface of a corresponding dielectric layer, and each of the word line extends along the first direction; the step region includes a first region and second regions located on two sides of the first region, and the first region extends along the second direction; and the first region includes a support structure that wraps a part of the active layers, and a part of the active layers in the step region is electrically connected to the word lines.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure. Apparently, the accompanying drawings in the following description show merely some embodiments of the present disclosure, and those of ordinary skill in the art may still derive other accompanying drawings from these drawings without creative efforts.

DETAILED DESCRIPTION

Figure 1:
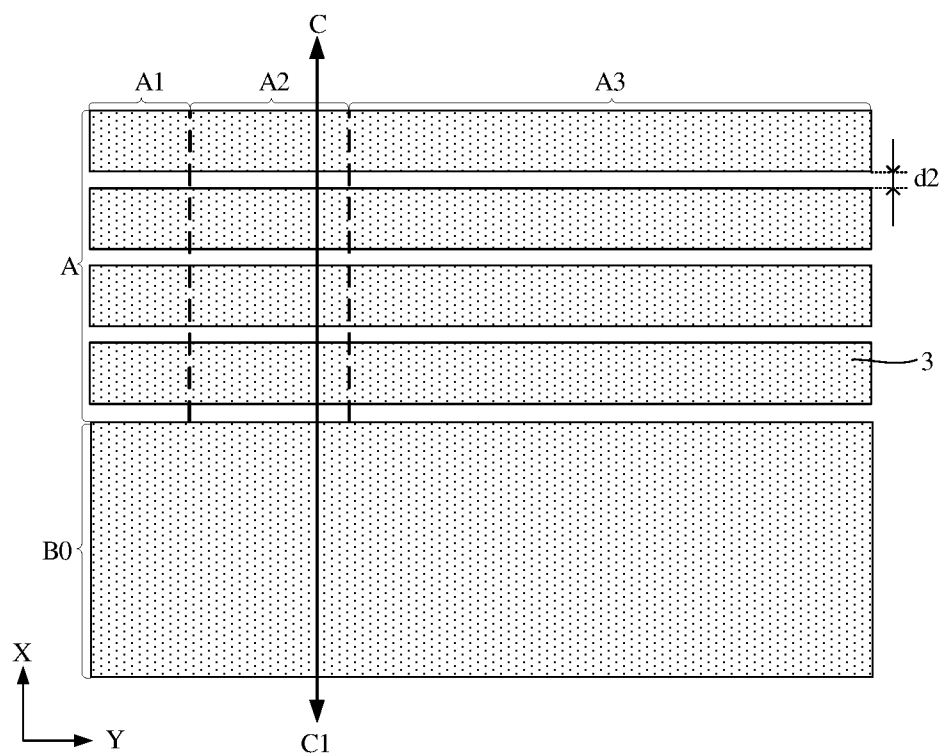
FIG. 1 to FIG. 26 are schematic structural diagrams corresponding to a method of manufacturing a semiconductor structure according to an embodiment of the present disclosure.

It can be learned from the background that the yield of the semiconductor structure is to be improved. It is found through analysis that the main reason is that the 3D stacked DRAM has a plurality of layers of word lines provided on the base and the word lines need to be drawn out through a part of active layers in a step region. However, the part of the active layers in the step region is prone to collapse, thus affecting the yield of the semiconductor structure.

An embodiment of the present disclosure provides a method of manufacturing a semiconductor structure. A support structure that wraps a part of active layers is formed in a first region of a step region. The support structure can support a part of the active layers and prevent the part of the active layers from collapsing, thereby improving performance and a yield of the semiconductor structure. In addition, before the forming the support structure, first conductorization is performed on a part of the active layers in the first region, and after the forming the support structure, second conductorization is performed on a part of the active layers in second regions, such that a part of the active layers after the conductorizations can be electrically connected to the word lines, thereby helping draw out the word lines.

The embodiments of the present disclosure are described in detail below with reference to the accompanying drawings. However, those skilled in the art may understand that in each embodiment of the present disclosure, many technical details are proposed to help readers better understand the embodiments of the present disclosure. However, even without these technical details and various changes and modifications made based on the following embodiments, the technical solutions claimed in the embodiments of the present disclosure can still be implemented.

As shown in FIG. 1 to FIG. 26, an embodiment of the present disclosure provides a method of manufacturing a semiconductor structure. The method of manufacturing a semiconductor structure provided in the embodiment of the present disclosure is described in detail below with reference to the accompanying drawings. It should be noted that, for ease of description and clear illustration of the method of manufacturing a semiconductor structure, FIG. 1 to FIG. 26 are all partial schematic structural diagrams of the semiconductor structure.

It should be first noted that, the semiconductor structure has a first direction X, a second direction Y, and a third direction Z inside. The first direction X is a direction in which a transistor region A and an initial step region B0 are arranged. The transistor region A includes a first source-drain region A1, a word line region A2, and a second source-drain region A3 arranged in sequence. The second direction Y is a direction in which the first source-drain region A1, the word line region A2, and the second source-drain region A3 are arranged. The third direction Z is a direction perpendicular to a surface of a base 1. The first direction X and the second direction Y are perpendicular to each other and are both parallel to the surface of the base 1. In addition, the initial step region B0 may be subsequently patterned to form a step region B that directly faces and is connected to the word line region A2, that is, the transistor region A and the step region B are arranged still in the first direction X.

Figure 2:
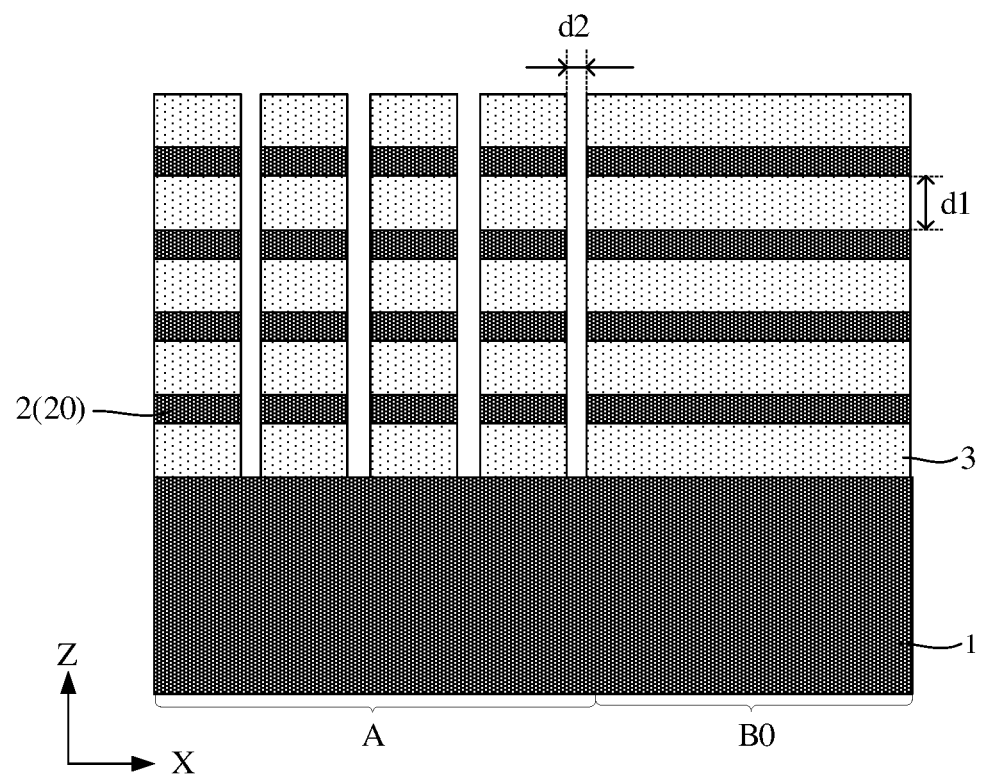

FIG. 1 is a top view, FIG. 2 is a cross-sectional view of FIG. 1 along a direction C-C1, and the base 1 is not shown in FIG. 1. Referring to FIG. 1 and FIG. 2, the base 1 is provided, and sacrificial layers 3 and active layers 20 that are alternately arranged are formed on the base 1. For example, a whole surface of deposited silicon-germanium is formed on the base 1 as the sacrificial layer 3, and a whole surface of deposited silicon is formed on the base 1 as the active layer 20. That is, the sacrificial layer 3 is located in both the transistor region A and the initial step region B0, and the active layer 20 is also located in both the transistor region A and the initial step region B0.

Still referring to FIG. 1 and FIG. 2, part of the sacrificial layers 3 and part of the active layers 20 are etched to form a plurality of trenches that are arranged at intervals in the transistor region A. Each trench runs through all the sacrificial layers 3 and all the active layers 20, that is, the trenches can divide a part of the active layers 20 in the transistor region A into a plurality of discrete active structures 2. Each trench extends along the second direction Y.

Each active structure 2 includes a first source/drain, a channel region, and a second source/drain arranged in sequence in the second direction Y. The first source/drain is located in the first source-drain region A1, the channel region is located in the word line region A2, and the second source/drain is located in the second source-drain region A3. A doping type of the first source/drain and a doping type of the second source/drain are the same and are opposite to a doping type of the channel region. In some other embodiments, a doping type of the first source/drain, a doping type of the second source/drain, and a doping type of the channel region may alternatively be the same, such that a junctionless transistor is formed.

A position relationship between the plurality of active structures 2 is described in detail below.

In the first direction X, there is a second distance d2 between adjacent ones of parts of the active layers 20. In a direction perpendicular to the surface of the base 1, that is, in the third direction Z, there is a first distance d1 between adjacent ones of the active layers 20. The first distance d1 is greater than the second distance d2. Word lines 62 extending along the first direction X are subsequently formed. Therefore, a relatively small second distance d2 helps each word line 62 connect to a part of a plurality of active structures 2 in the first direction X. A plurality of word lines 62 are arranged in the third direction Z and are insulated from each other. Therefore, a relatively large first distance d1 can avoid interconnection between upper and lower layers of word lines 62. This is to be subsequently described in detail with reference to the accompanying drawings.

In some embodiments, a ratio of the first distance d1 to the second distance d2 is greater than 4. When the ratio of the two remains in the foregoing range, it helps the word line 62 fill a gap between adjacent ones of parts of the active structures 2 on a same layer, and further helps improve an isolation effect of adjacent ones of parts of the active structures 2 of upper and lower layers.

Figure 3:
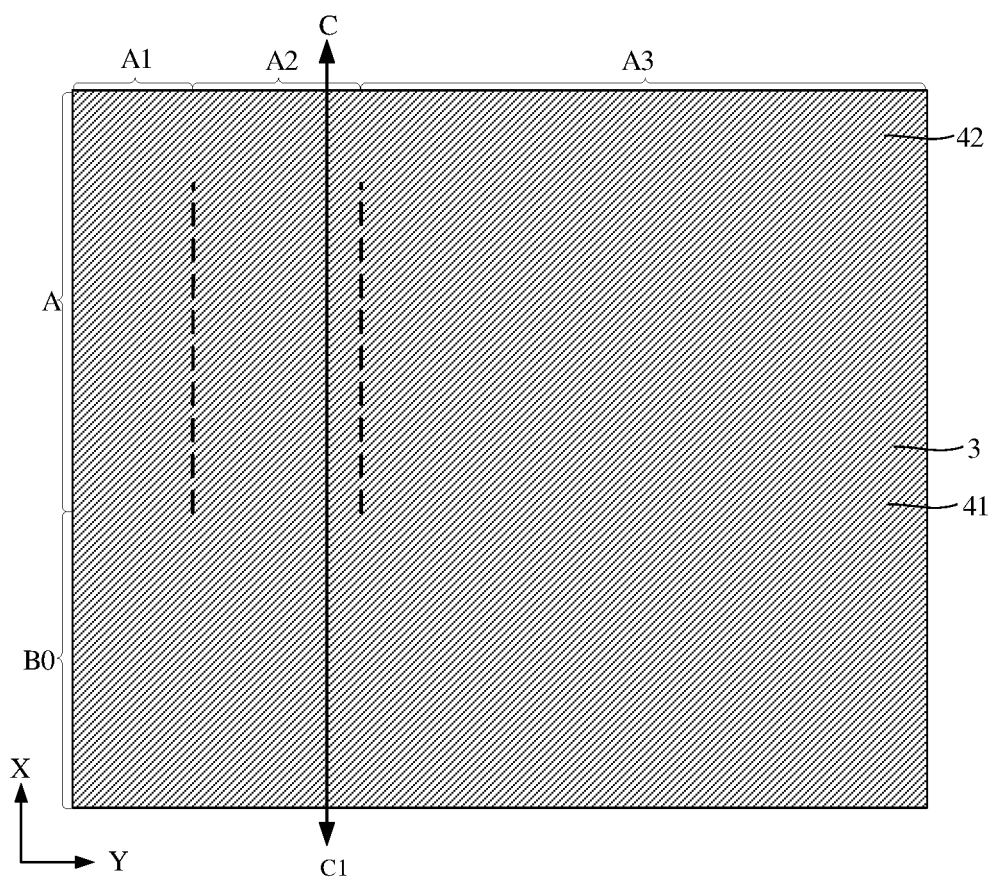
Figure 4:
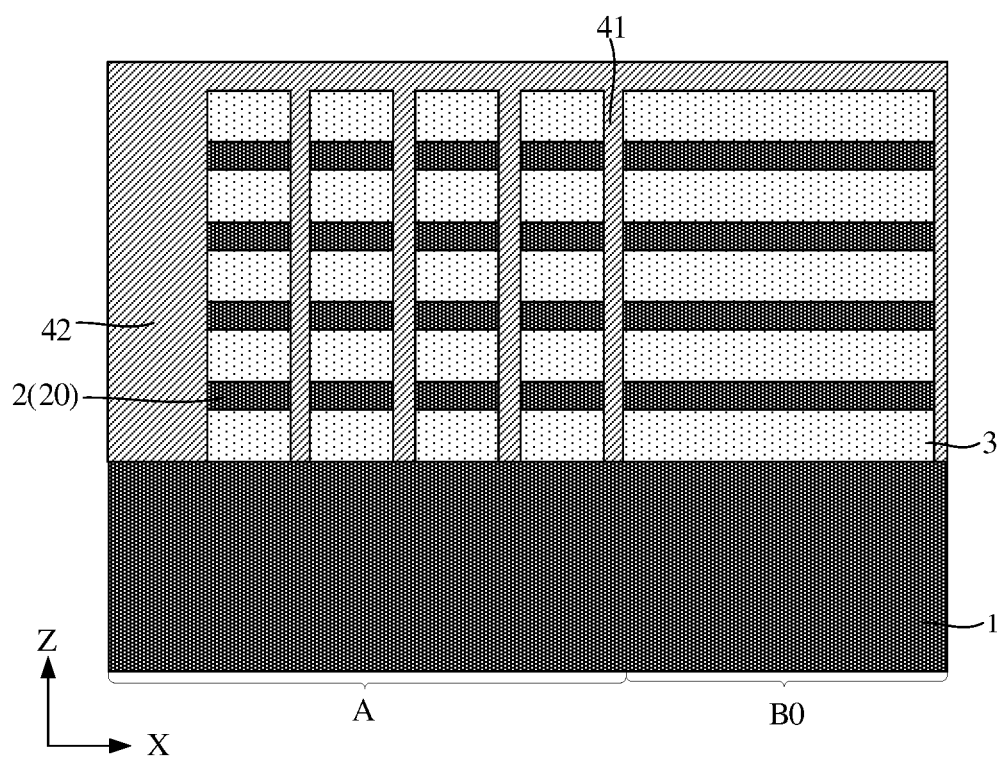

FIG. 3 is a top perspective view. FIG. 4 is a cross-sectional view of FIG. 3 along a direction C-C1. Referring to FIG. 3 and FIG. 4, first isolation layers 41 filling the trenches are formed. In other words, the first isolation layer 41 extends along the second direction Y, and each first isolation layer 41 is located in the sacrificial layers 3 and the active layers 20, and the first isolation layers divide a part of the active layers 20 into a plurality of active structures 2. For example, silicon oxide is deposited in the trenches as the first isolation layers 41. It should be noted that, in the deposition process, part of the deposition material of the first isolation layers 41 further covers the sacrificial layer 3 located on a top layer, and this part of deposition material may be removed before subsequent removal of the sacrificial layer 3.

In some embodiments, an edge isolation layer 42 is further provided on the periphery of each of the transistor region A and the initial step region B0, and the edge isolation layer 42 can isolate the transistor region A and the initial step region B0 from other regions in the semiconductor structure. The edge isolation layer 42 may be formed before the forming the sacrificial layers 3 and the active layers 20 or may be formed at the same time as the first isolation layers 41.

Figure 5:
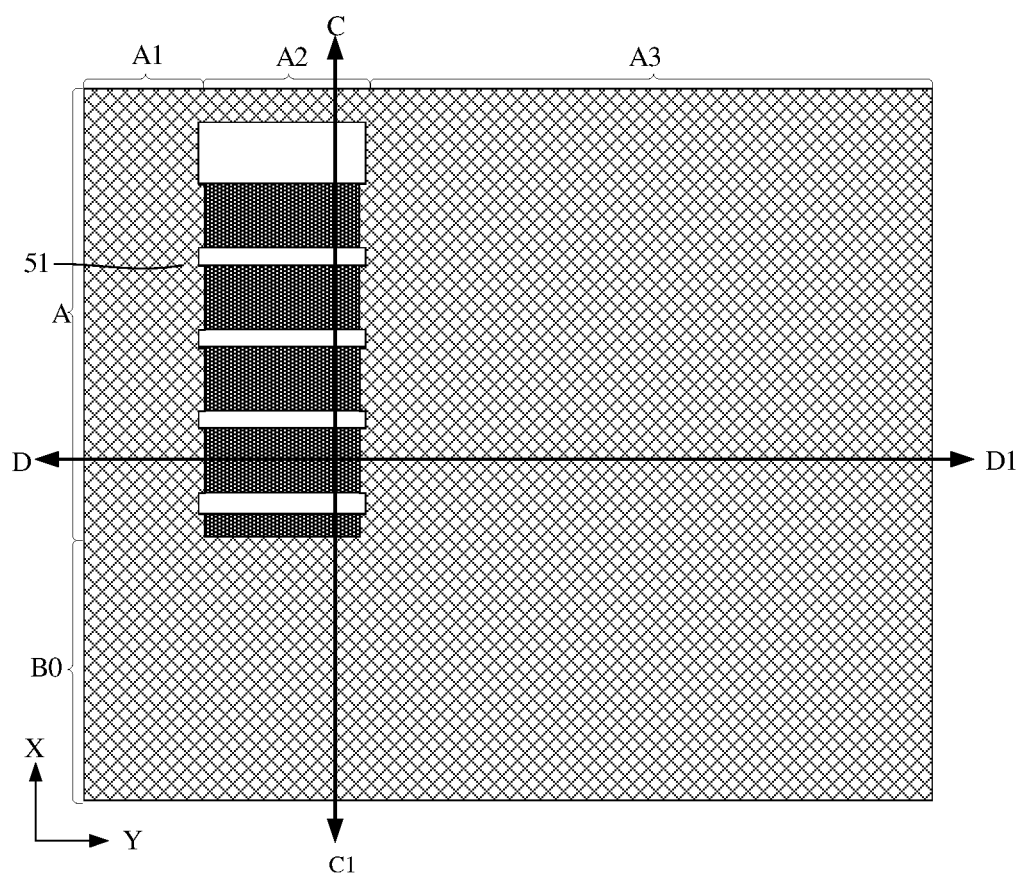
Figure 6:
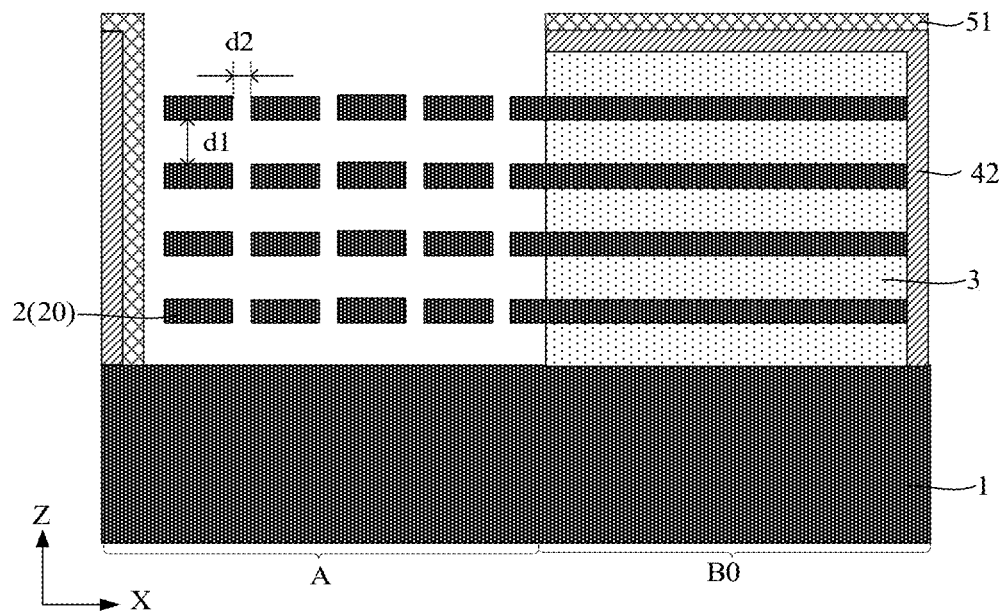
Figure 7:
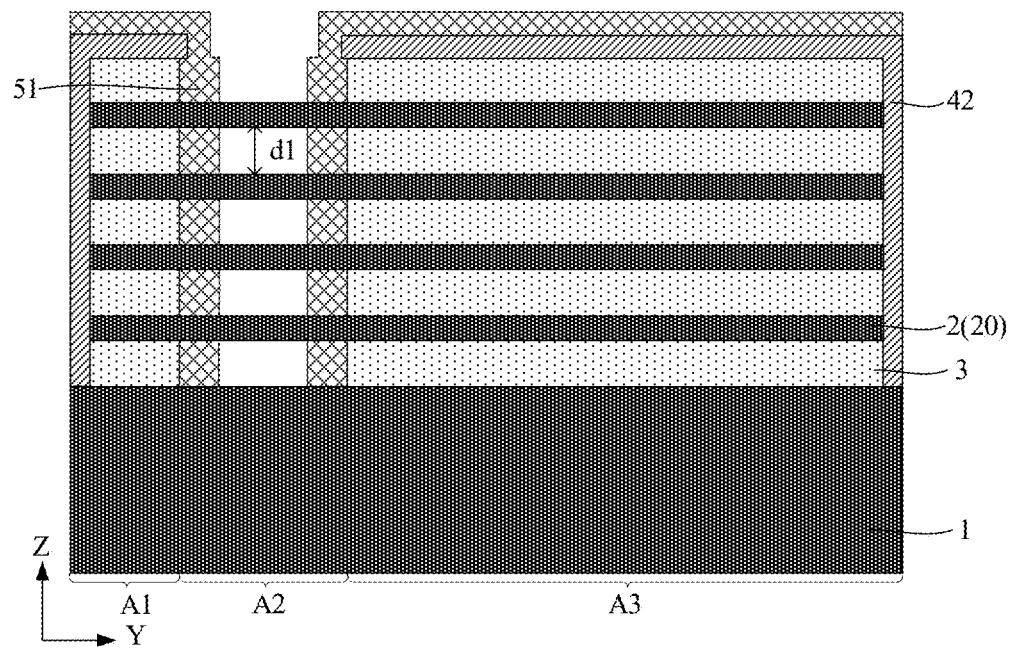

FIG. 5 is a top view. FIG. 6 is a cross-sectional view of FIG. 5 along a direction C-C1. FIG. 7 is a cross-sectional view of FIG. 5 along a direction D-D1. Referring to FIG. 5 to FIG. 7, a part of the first isolation layers 41 in the word line region A2 and a part of the sacrificial layers 3 in the word line region A2 are removed to expose a part of the active structures 2 in the word line region A2.

In some embodiments, the word line region A2 has two opposite sides arranged in the second direction Y. In this case, part of the first isolation layers 41 and part of the sacrificial layers 3 located on the two sides may be first removed to expose a part of the active structures 2 located on the two opposite sides of the word line region A2.

Subsequently, a third isolation layer 51 is formed on the two opposite sides of the word line region A2. Referring to FIG. 7, the third isolation layer 51 further covers a sidewall of a part of the sacrificial layers 3 in the first source-drain region A1 and a sidewall of a part of the sacrificial layers in the second source-drain region A3 and a partial surface of each of the active structures 2 located in the word line region A2. The third isolation layer 51 can isolate each word line 62 from a subsequently formed capacitor and bit line, and can support a part of the active structures 2 in the word line region A2, thereby improving robustness of the semiconductor structure and avoiding collapse.

For example, silicon nitride is deposited on the two opposite sides of the word line region A2 as the third isolation layer 51. In the deposition process, the deposition material of the third isolation layer 51 may further cover a top surface of each first isolation layer 41.

In some other embodiments, the third isolation layer 51 may further be located on a side of the first source-drain region A1 close to the word lines 62 and a side of the second source-drain region A3 close to the word line region A2.

After the forming the third isolation layer 51, the remaining part of the first isolation layers 41 in the word line region A2 and the remaining part of the sacrificial layers 3 in the word line region A2 are removed to expose a part of the active structures 2. The exposed part of each active structure 2 is used as a channel region of a transistor. For example, the part of the first isolation layers 41 and the part of the sacrificial layers 3 may be removed by using a wet etching process.

Figure 8:
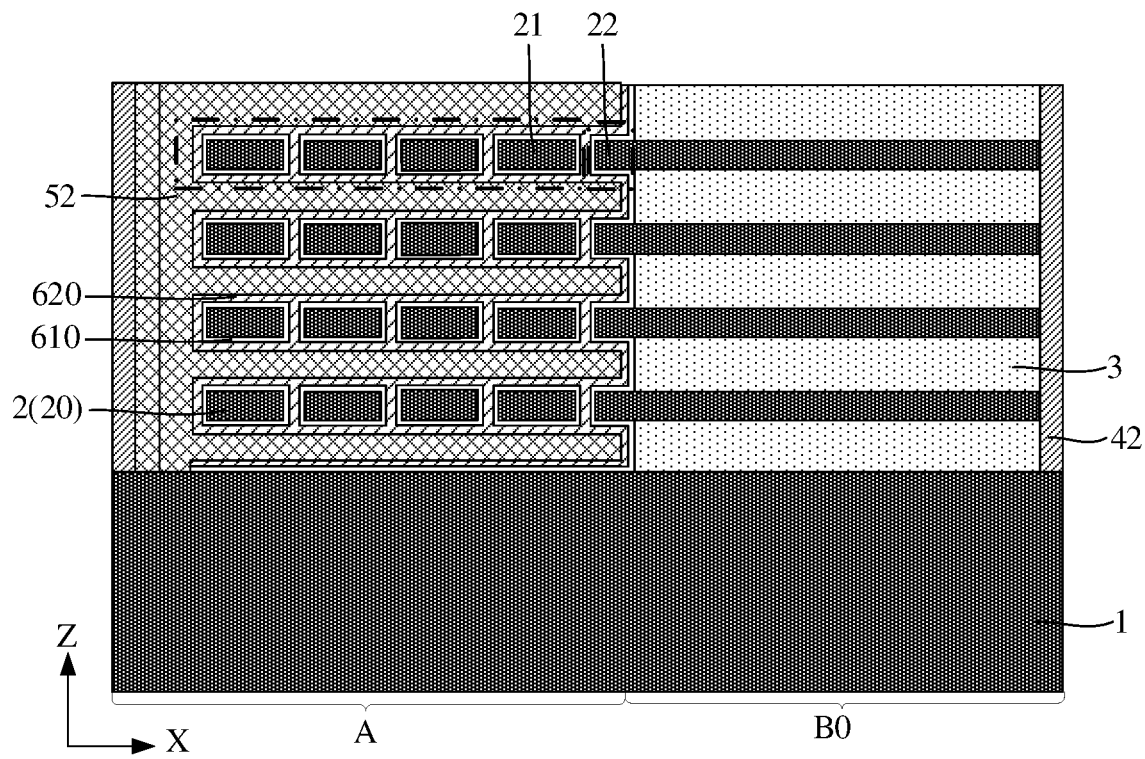
Figure 9:
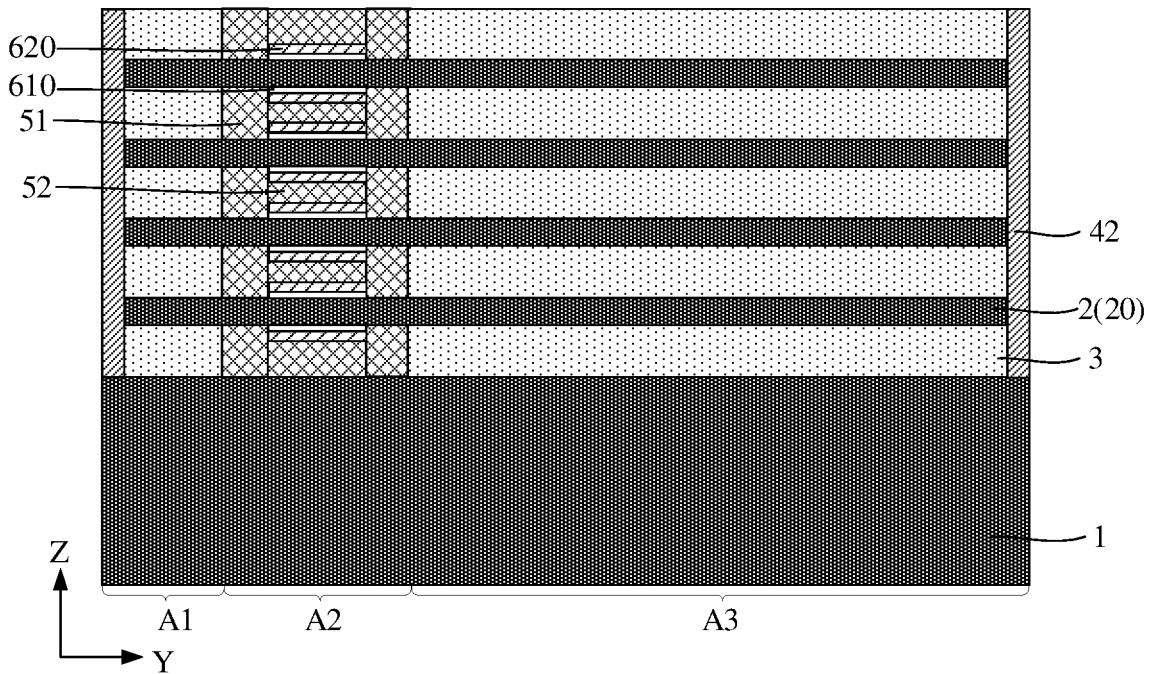

FIG. 8 is a cross-sectional view of a semiconductor structure along a direction C-C1. FIG. 9 is a cross-sectional view of a semiconductor structure along a direction D-D1. Referring to FIG. 8 and FIG. 9, an initial dielectric layer 610 and an initial word line 620 covering the initial dielectric layer 610 are formed.

Specifically, referring to FIG. 8, a part of each layer of the active structures 2 in the word line region A2 include a first active structure 21 and a second active structure 22. There may be a plurality of first active structures 21, and there may be one second active structure 22. The first active structure 21 is located on a side of the word line region A2 away from the step region B, and the first active structure 21 is spaced apart from a part of the corresponding active layer 20 in the step region B. The second active structure 22 is located on a side of the word line region A2 close to the step region B, and the second active structure 22 is connected to a part of the corresponding active layer 20 in the step region B. The initial dielectric layer 610 covers a surface of each first active structure 21 and further covers a top surface, a bottom surface, and a side face that faces the corresponding first active structure 21 of each second active structure 22 and a sidewall of the word line region A2 facing the step region B. For example, a material such as silicon oxide, zirconium oxide, aluminum oxide, silicon oxide, silicon nitride, hafnium oxide, or niobium oxide is deposited in the word line region A2 through an atomic layer deposition process as the initial dielectric layer 610.

The initial word line 620 wraps each first active structure 21 and is further located on the top surface, the bottom surface, and the side face that faces the corresponding first active structure 21 of each second active structure 22 and the sidewall of the word line region A2 facing the step region B. For example, a material such as titanium, titanium nitride, tungsten, molybdenum, or cobalt is deposited in the word line region A2 through an atomic layer deposition process as the initial word line 620.

It should be noted that, because the first distance d1 is greater than the second distance d2, the initial word line 620 fills a gap between adjacent ones of parts of the active structures 2 in the first direction X, but does not fill a gap between adjacent ones of parts of the active structures 2 in the third direction Z, that is, parts of the initial word line 620 are interconnected in the first direction X and are spaced apart from each other in the third direction Z.

Still referring to FIG. 8 and FIG. 9, a second isolation layer 52 is formed. The second isolation layer 52 fills between adjacent ones of parts of the initial word line 620 of upper and lower layers. That is, the second isolation layer 52 is used to isolate subsequently formed adjacent ones of word lines 62. In addition, the second isolation layer 52 is located on a top surface of the initial word line 620 and a side face of the initial word line 620. For example, a low dielectric constant material such as silicon nitride, silicon oxide, or undoped polycrystalline silicon is deposited in the word line region A2 as the second isolation layer 52. The low dielectric constant material helps reduce a parasitic capacitance between adjacent ones of the word lines 62.

Figure 10:
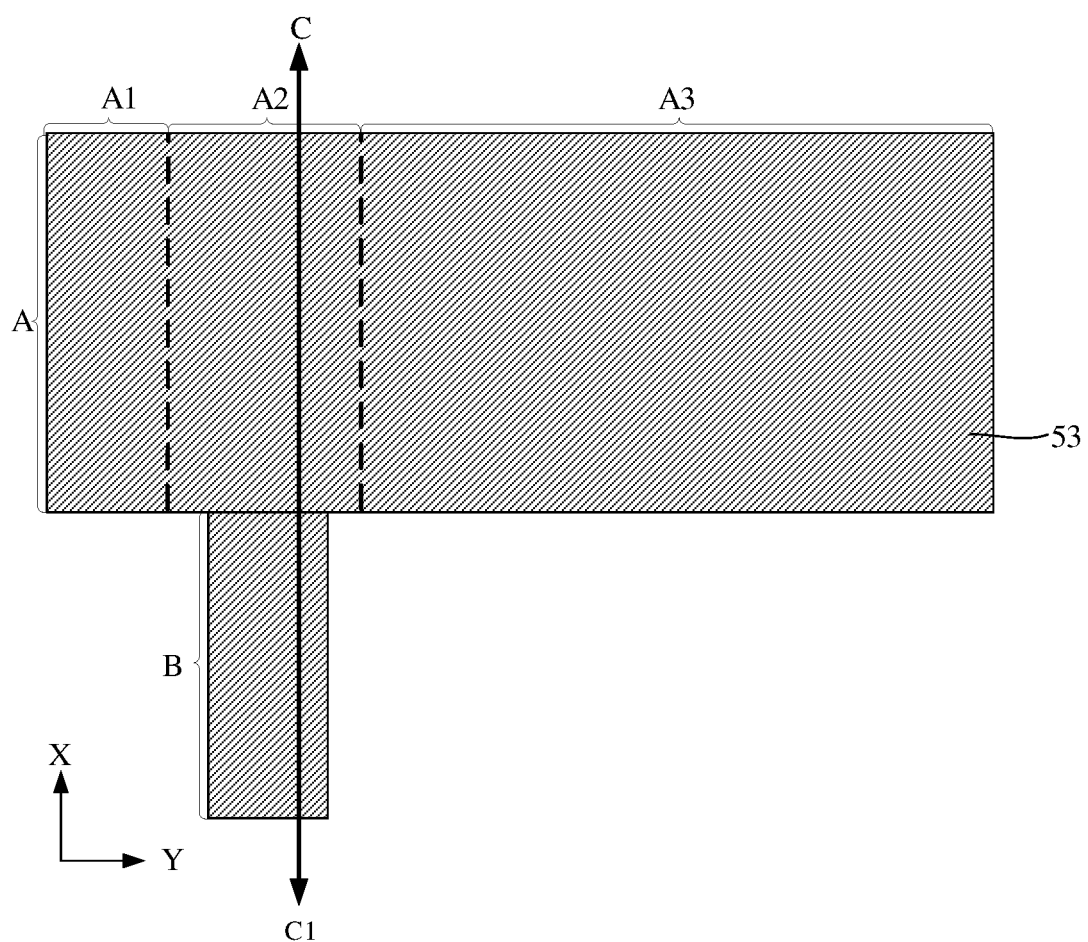
Figure 11:
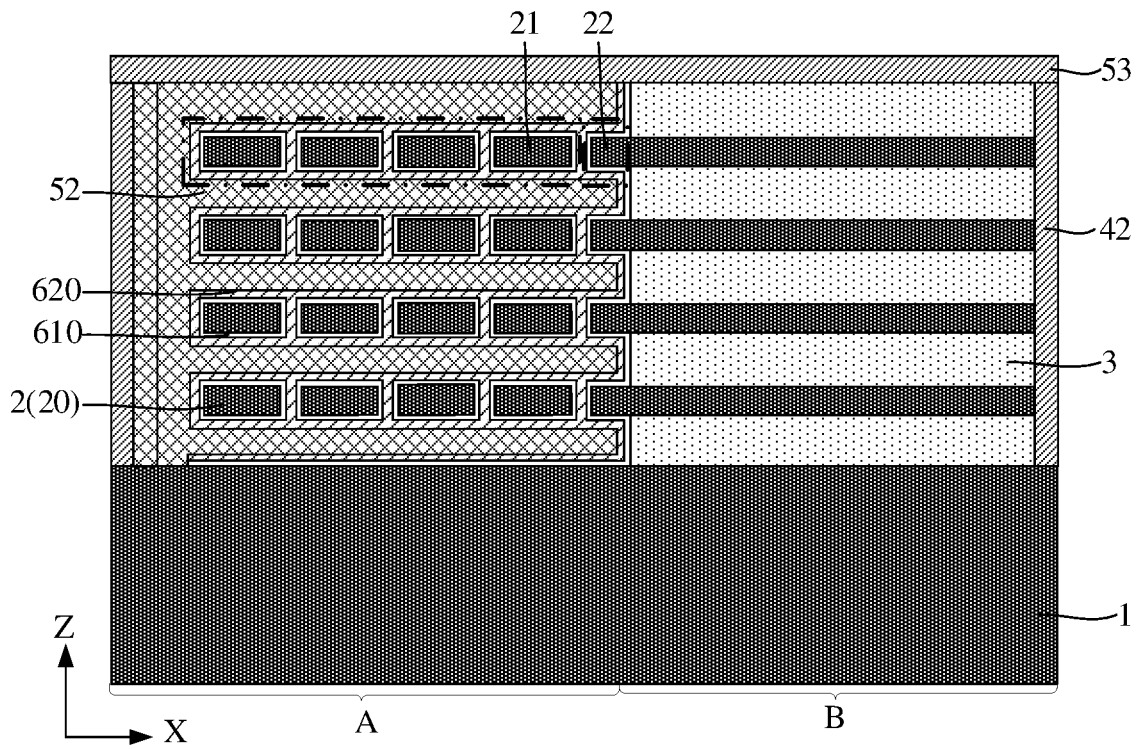

FIG. 10 is a top view. FIG. 11 is a cross-sectional view of FIG. 10 along a direction C-C1. Referring to FIG. 10 and FIG. 11, the initial step region B0 is patterned to form the step region B. The step region B directly faces and is connected to the word line region A2. For example, a part of the initial step region B0 other than the step region B is removed by using a dry etching process.

Still referring to FIG. 10 and FIG. 11, a protective layer 53 is formed on a sidewall of the step region B to protect a part of the active layers 20 in the step region B. For example, a material such as silicon oxide, silicon nitride, or undoped polycrystalline silicon is deposited in the step region B through a chemical vapor deposition process or an atomic layer deposition process as the protective layer 53. In the deposition process, the protective layer 53 further covers a top surface of the sacrificial layer 3 and a top surface of the second isolation layer 52.

Figure 12:
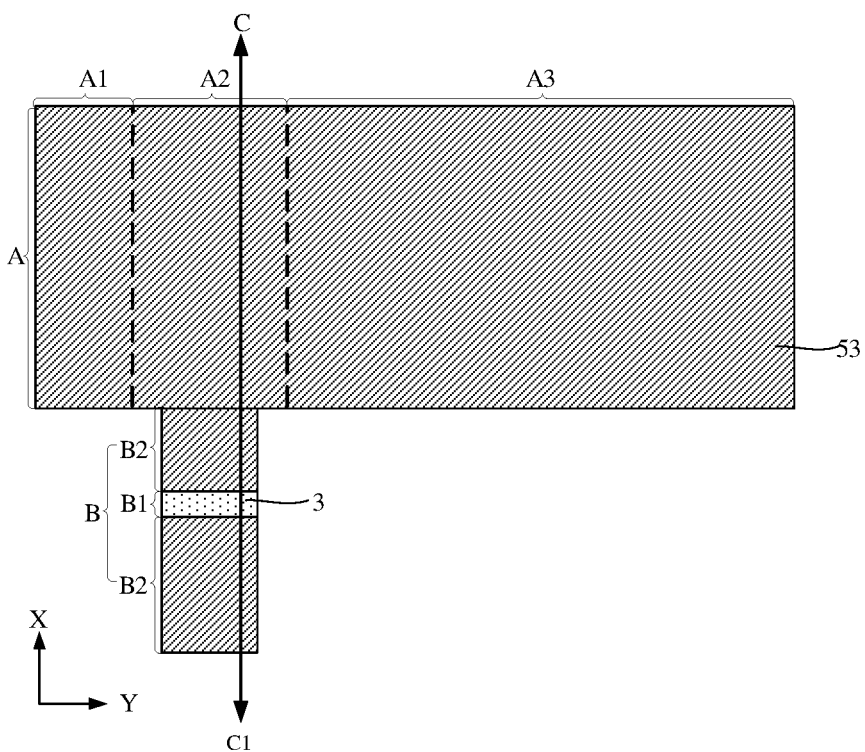
Figure 13:
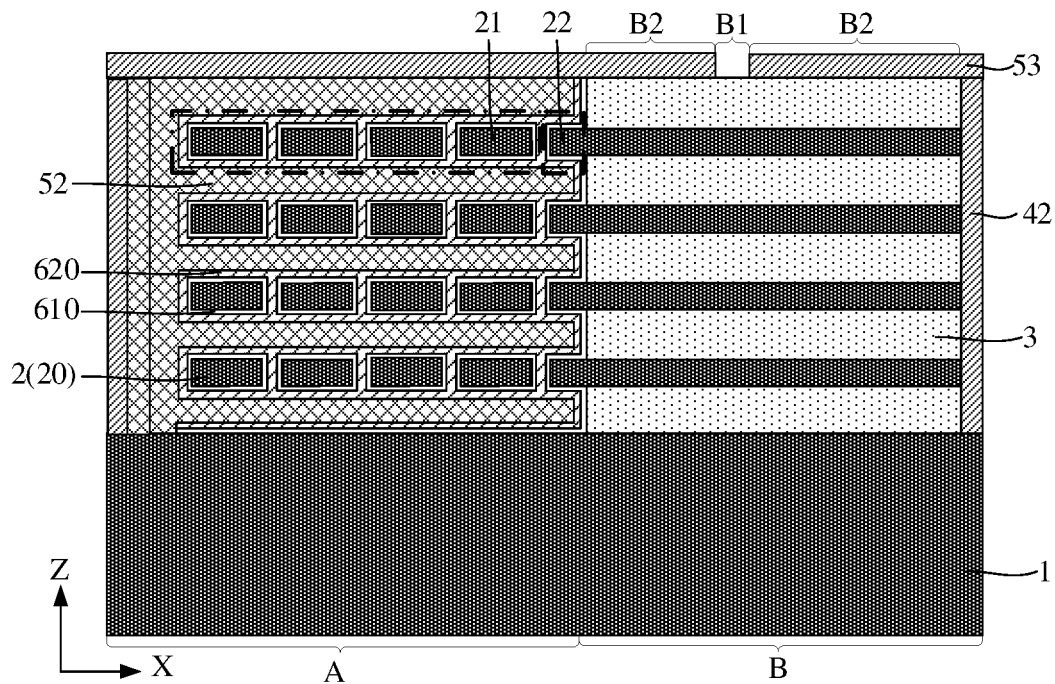

FIG. 12 is a top view. FIG. 13 is a cross-sectional view of FIG. 12 along a direction C-C1. Referring to FIG. 12 and FIG. 13, a part of the protective layer 53 located on the top surface of the sacrificial layer 3 is etched to form an opening. The opening is located in the step region B. The step region B includes a first region B1 and second regions B2 located on two sides of the first region B1. The first region B1 extends along the second direction Y. That is, the first region B1 and the two second regions B2 are arranged in the first direction X. The opening is further located directly above the first region B1 and exposes a part of the sacrificial layer 3 located in the first region B1. In addition, the opening further exposes a part of the protective layer 53 located on a sidewall of the first region B1.

Figure 14:
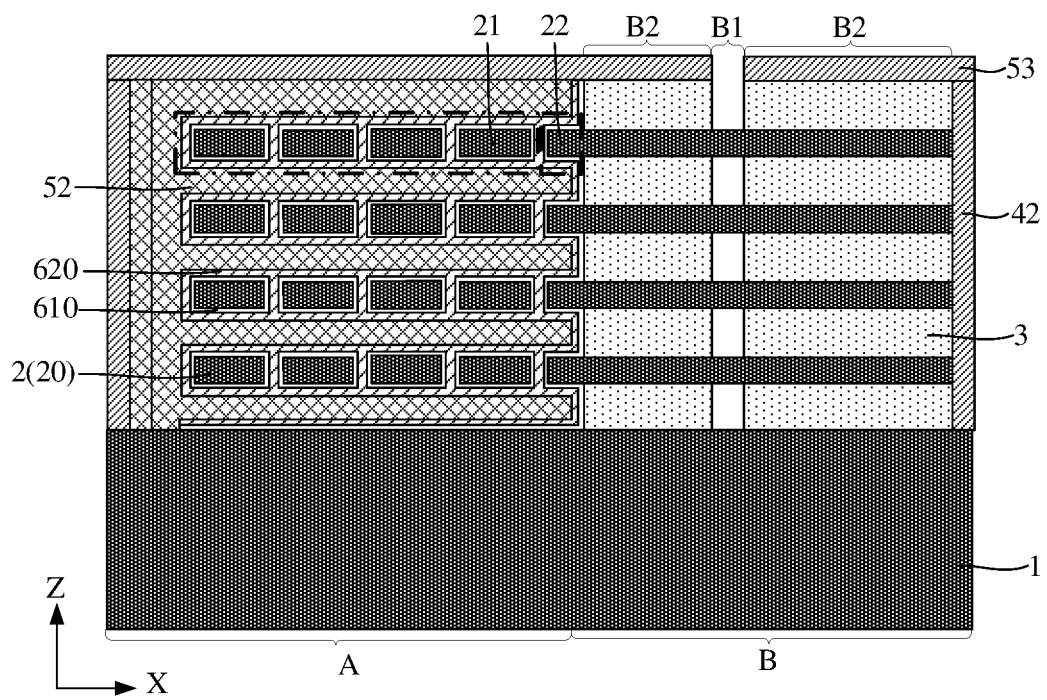

Referring to FIG. 14, a part of the sacrificial layers 3 in the first region B1 is etched along the opening to expose a part of the active layers 20 in the first region B1. For example, the part of the sacrificial layers 3 may be removed by using a wet etching process. In addition, the part of the protective layer 53 located on the sidewall of the first region B1 may be further removed. Subsequently, a support structure 54 is formed in the first region B1 to preliminarily support a part of the active layers 20 in the step region B, thereby preventing the part of the active layers 20 from collapsing.

Figure 15:
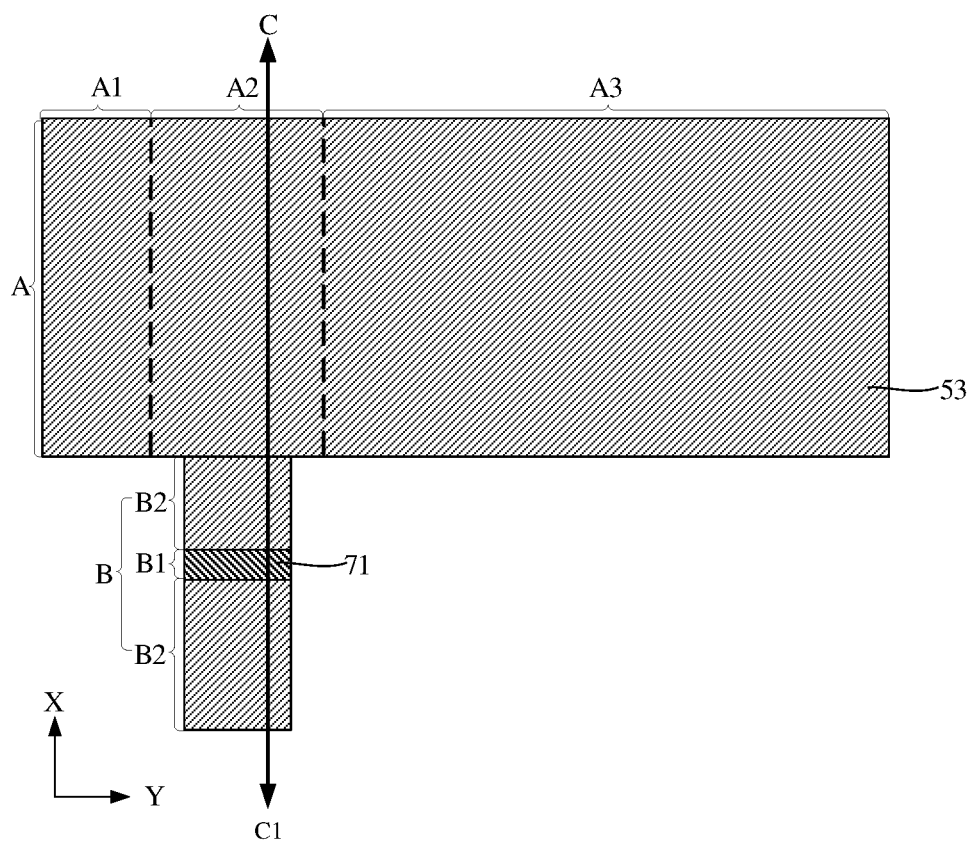
Figure 16:
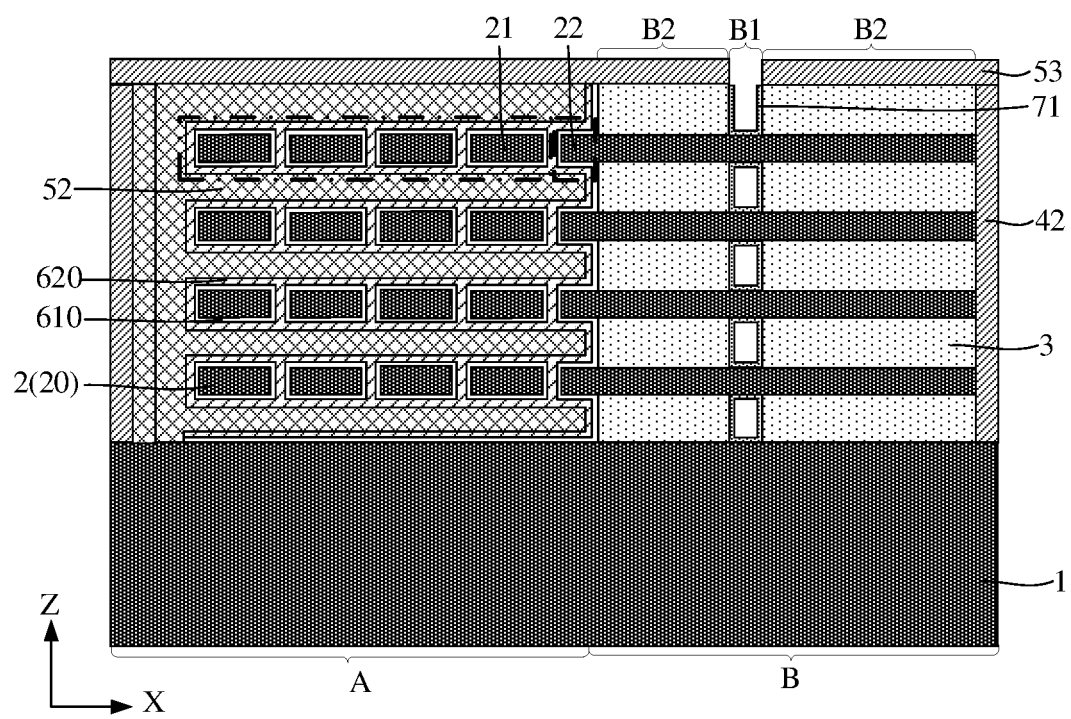

Referring to FIG. 15 and FIG. 16, FIG. 15 is a top view, and FIG. 16 is a cross-sectional view of FIG. 15 along a direction C-C1. A first metal layer 71 is formed on a surface of the part of the active layers 20 in the first region B1. The first metal layer 71 further covers a sidewall of the part of the sacrificial layers 3 facing the first region B1. For example, a material such as Ti, Co, W, Pt, Pd, Mo, Ta, Ru, or Ni is deposited on the surface of the part of the active layers 20 as the first metal layer 71.

Figure 17:
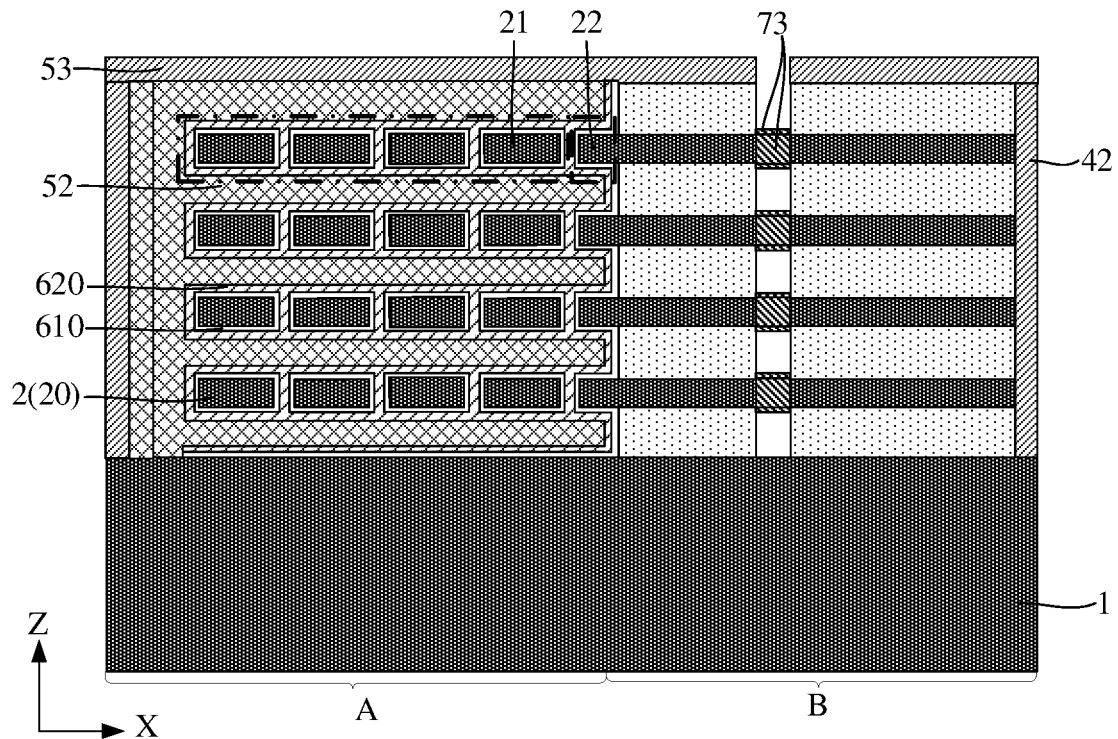

Referring to FIG. 17, a first heat treatment is performed, such that the first metal layer 71 reacts with the part of the active layers 20 in the first region B1 to generate a first metal silicide layer 73. That is, metal atoms in the first metal layer 71 interdiffuse with silicon atoms in the part of the active layers 20, generating a metal silicide under high temperature conditions. In other words, a partial thickness of the first metal layer 71 and the part of the active layers 20 in the first region B1 are jointly transformed into the first metal silicide layer 73. Compared with the original active layer 20, the first metal silicide layer 73 has a lower resistance.

Still referring to FIG. 17, an unreacted part of the first metal layer 71 is removed after the first heat treatment. In this process, a part of the first metal layer 71 located on the sidewall of a part of the sacrificial layers 3 facing the first region B1 is mainly removed to avoid interconnection between upper and lower parts of the first metal silicide layer 73. In addition, the unreacted part of the first metal layer 71 located on a surface of the part of the original active layers 20 is also removed.

In this way, based on FIG. 15 to FIG. 17, first conductorization may be performed on the part of the active layers 20 in the first region B1, thereby reducing a resistance of the part of the active layers 20. In other words, the forming the first metal layer 71, performing the first heat treatment, and removing the unreacted part of the first metal layer 71 jointly constitute the first conductorization. In some other embodiments, the first conductorization may be: heavily doping the part of the active layers 20 in the first region B1.

Figure 18:
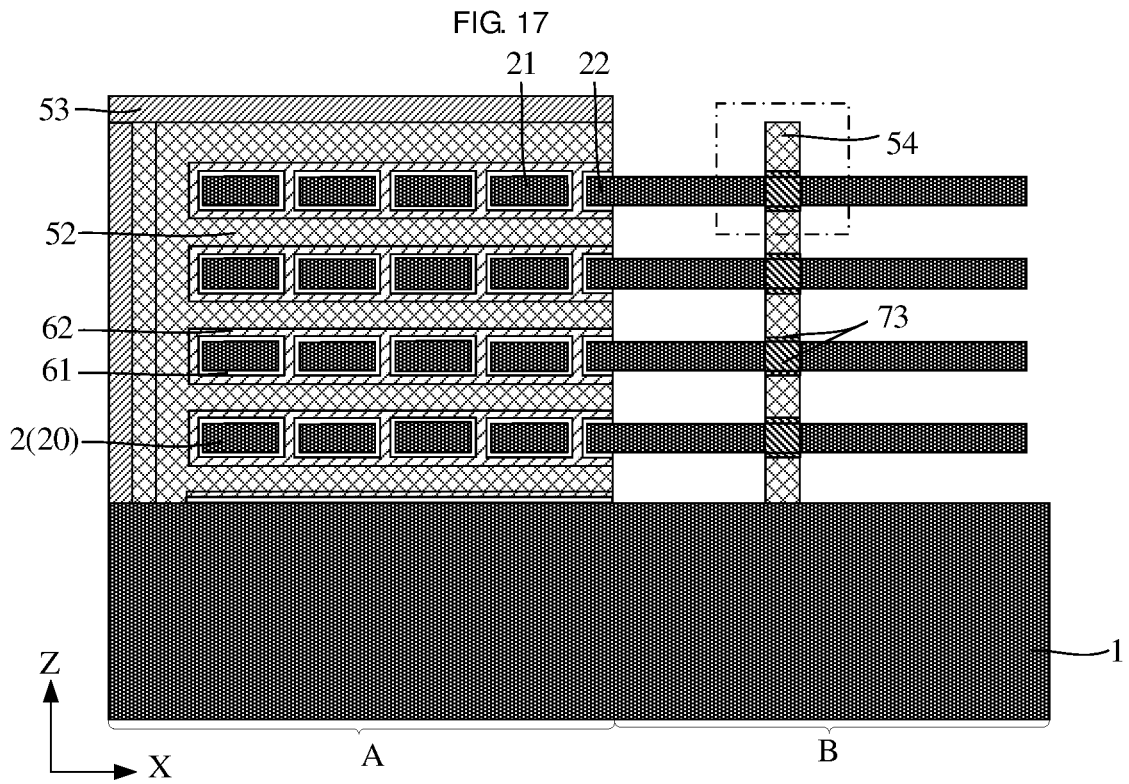
Figure 19:
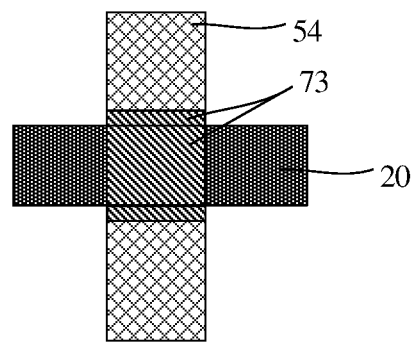

FIG. 19 is an enlarged view of a structure within a dashed box in FIG. 18. Referring to FIG. 18 and FIG. 19, a support structure 54 is formed, and the support structure 54 wraps the part of the active layers 20 in the first region B1. That is, the support structure 54 fills upper and lower sides of a part of each active layer 20 in the first region B1, and the part of each active layer 20 in the first region B1 has two opposite sides arranged in the second direction Y. The support structure 54 further covers the two opposite sides, such that the part of each of the active layers 20 in the first region B1 is surrounded by the support structure 54. In other words, the support structure 54 is a mesh structure, and the part of each active layer 20 in the step region B runs through the support structure 54.

For example, silicon nitride is deposited in the first region B1 through a chemical vapor deposition process as the support structure 54.

In the first direction X, a ratio of a width of the support structure 54 to a width of a part of the active layers 20 located in the step region B is 1:5 to 1:10. It should be noted that, if the ratio of the widths of the two is too small, a support effect of the support structure 54 may be reduced; if the ratio of the widths of the two is too large, after the removing the part of the sacrificial layers 3 in the first region B1, an exposed area of the part of the active layers 20 is too large, which is not conducive to improvement of robustness of the part of the active layers 20. When the ratio of the widths of the two remains in the foregoing range, it is conducive to considering both the foregoing problems, thereby preventing the part of the active layers 20 from collapsing.

Referring to FIG. 19, the remaining part of the first metal layer 71 is located between the part of the active structures 2 and the support structure 54, and does not cover a sidewall of the support structure 54, thereby avoiding interconnection between upper and lower parts of the active layers 20.

Still referring to FIG. 18 and FIG. 19, after the forming the support structure 54, a part of the sacrificial layers 3 in the second regions B2 is removed to expose a part of the active layers 20 in the second regions B2. For example, the part of the sacrificial layers 3 is removed by using a wet etching process.

Still referring to FIG. 18 and FIG. 19, after the removing the part of the sacrificial layers 3 located in the second regions B2, a part of the initial dielectric layer 610 located on the sidewall of the word line region A2 facing the step region B and a part of the initial word line 620 located on the sidewall of the word line region A2 facing the step region B are removed, the remaining part of the initial dielectric layer 610 is used as the dielectric layers 61, and the remaining part of the initial word line 620 is used as the word lines 62. That is, the initial dielectric layer 610 and the initial word line 620 are truncated to avoid interconnection between word lines 62 in the third direction Z.

In this way, a plurality of word lines 62 and a plurality of dielectric layers 61 may be formed in the word line region A2, each dielectric layer 61 is located on a part of surfaces of a plurality of the active structures 2, each word line 62 is located on a surface of the corresponding dielectric layer 61, and each word line 62 extends along the first direction X. Each word line 62 wraps a part of a plurality of active structures 2 located on a same layer in the word line region A2. In some other embodiments, each word line 62 may be located only on a partial surface of a part of the plurality of active structures 2. For example, each word line 62 is located on an upper side or a lower side of a part of the plurality of the active structures 2. Each dielectric layer 61 is located between the corresponding word line 62 and a part of the corresponding active structures 2.

Figure 20:
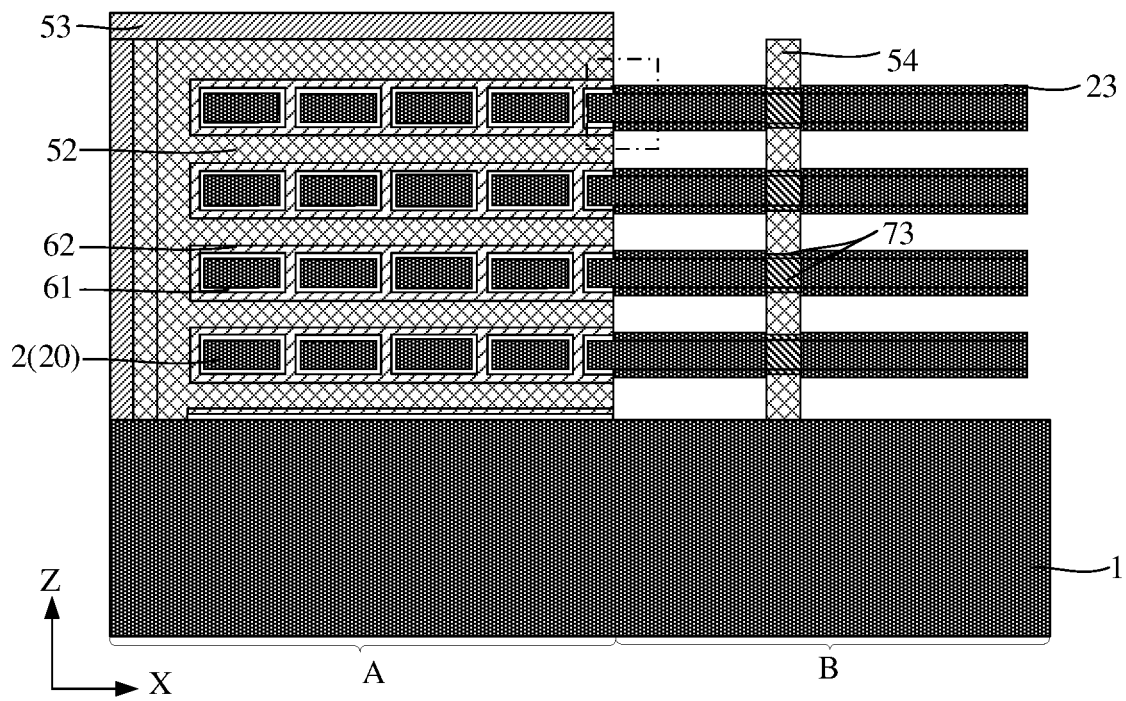
Figure 21:
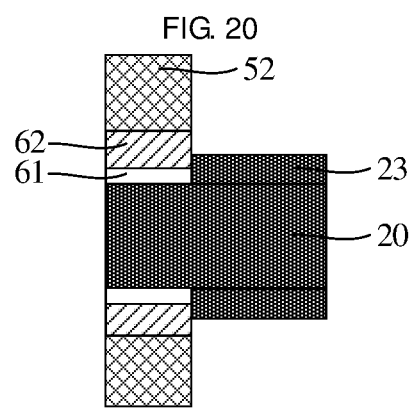

FIG. 21 is an enlarged view of a structure within a dashed box in FIG. 20. Referring to FIG. 20 and FIG. 21, a thickened layer 23 is formed on a surface of the part of the active layers 20 in the second regions B2. The thickened layer 23 is in contact with the word lines 62. Subsequently, second conductorization is performed on the thickened layer 23 and the part of the active layers 20, such that the thickened layer 23 and the part of the active layers 20 after the conductorization are electrically connected to the word lines 62. In other words, a contact area between the thickened layer 23 and the word lines 62 can be increased, thereby reducing a contact resistance, thus improving performance of the semiconductor structure.

In some embodiments, each word line 62 located above or below a part of a plurality of the active structures 2 has a first thickness, the thickened layer 23 has a second thickness, and a ratio of the first thickness to the second thickness is 4:1 to 1:1. It should be noted that, if the ratio of the first thickness to the second thickness is too small, the contact area between the thickened layer 23 and the word lines 62 is too small, and this is not conducive to reducing the contact resistance; if the ratio of the first thickness to the second thickness is too large, the thickened layer 23 may occupy a relatively large space area, and this is not conducive to isolating adjacent ones of parts of the active layers 20 of upper and lower layers. When the first thickness and the second thickness remain in the foregoing range, it is conducive to considering both the foregoing problems, and a subsequent isolation effect of parts of the active layers 20 can be ensured while the contact resistance is reduced.

For example, a method of forming the thickened layer 23 includes an epitaxial growth process. For example, a vapor phase epitaxy process may be used, and silicon atoms generated by a reactive gas are epitaxially grown on the surface of the part of the active layers 20. In addition, during the epitaxial growth, a dopant may be further introduced to reduce a resistance of the thickened layer 23.

In some other embodiments, the thickened layer 23 may alternatively not be formed, and only a second metal layer 72 is formed on the surface of the part of the active layers 20. The second metal layer 72 is in contact with the word lines 62. Therefore, the second metal layer 72 is also equivalent to a thickening of the part of the active layers 20, such that the part of the active layers 20 after conductorization can be electrically connected to the word lines 62.

Figure 22:
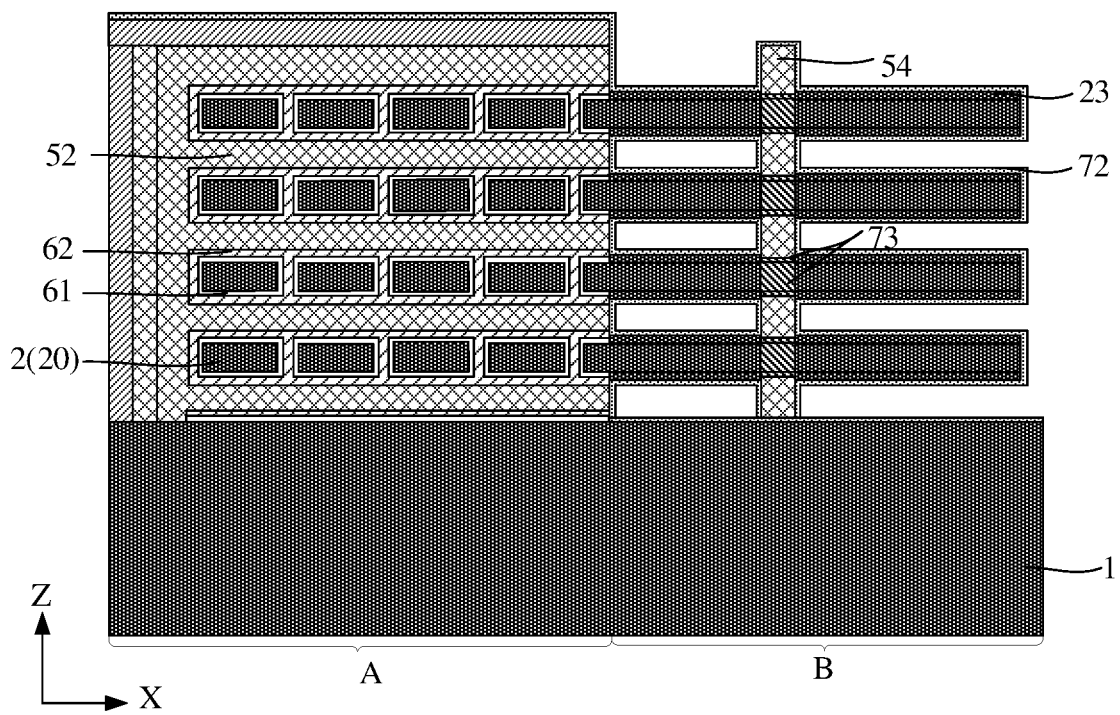

Referring to FIG. 22, a second metal layer 72 is formed on a surface of the part of the active layers 20 in the second regions B2. The second metal layer 72 further covers a surface of the support structure 54. In addition, the second metal layer 72 further covers the thickened layer 23, and the second metal layer 72 is in contact with the word lines 62. For example, a material such as Ti, Co, W, Pt, Pd, Mo, Ta, Ru, or Ni is deposited on the surface of the part of the active layers 20 as the second metal layer 72.

Figure 23:
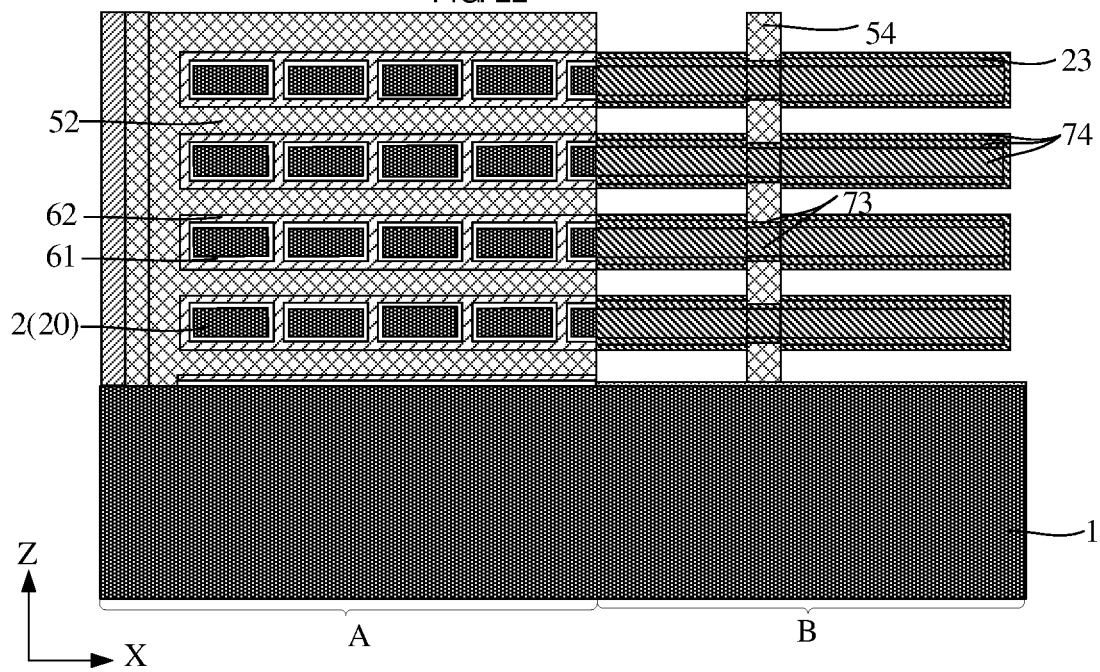

Referring to FIG. 23, a second heat treatment is performed, such that the second metal layer 72 reacts with the part of the active layers 20 in the second regions B2 to generate a second metal silicide layer 74. That is, metal atoms in the second metal layer 72 interdiffuse with silicon atoms in the part of the active layers 20, generating a metal silicide under high temperature conditions. Compared with the original active layer 20, the second metal silicide layer 74 has a lower resistance. In the second heat treatment, the metal atoms in the second metal layer 72 also interdiffuse with silicon atoms in the thickened layer 23, generating a metal silicide. In other words, a partial thickness of the second metal layer 72, the part of the active layers 20 in the second regions B2, and the thickened layer are jointly transformed into the second metal silicide layer 74.

Still referring to FIG. 23, an unreacted part of the second metal layer 72 is removed after the second heat treatment. In this process, a part of the second metal layer 72 located on a side face and a top surface of the support structure 54 are mainly removed to avoid interconnection between upper and lower parts of the second metal silicide layer 74. In addition, the unreacted part of the second metal layer 72 located on a surface of the part of the original active layers 20 is also removed.

In this way, as can be learned based on FIG. 22 and FIG. 23, the forming the second metal layer 72, performing the second heat treatment, and removing the unreacted part of the second metal layer 72 jointly constitute the second conductorization. The part of the active layers 20 after the second conductorization and the part of the active layers 20 after the first conductorization are electrically connected to the word lines 62.

In some other embodiments, the second conductorization may be: heavily doping the thickened layer 23 and the part of the active layers 20.

It should be noted that, after the forming the second metal silicide layer 74, a third heat treatment may be further performed on the first metal silicide layer 73 and the second metal silicide layer 74 at the same time. A temperature of the third heat treatment is higher than that of the first heat treatment and/or the second heat treatment, so as to reduce resistances of the first metal silicide layer 73 and the second metal silicide layer 74. A high-temperature heat treatment is performed on the first metal silicide layer 73 and the second metal silicide layer 74 at the same time, such that the number of high-temperature heat treatments can be reduced, thereby effectively reducing a thermal budget of a preparation process and improving preparation efficiency. In some other embodiments, the third heat treatment may alternatively be performed directly after the first heat treatment, and the third heat treatment may be performed directly after the second heat treatment. In this way, the resistance of the first metal silicide layer 73 or the second metal silicide layer 74 can also be reduced.

Figure 24:
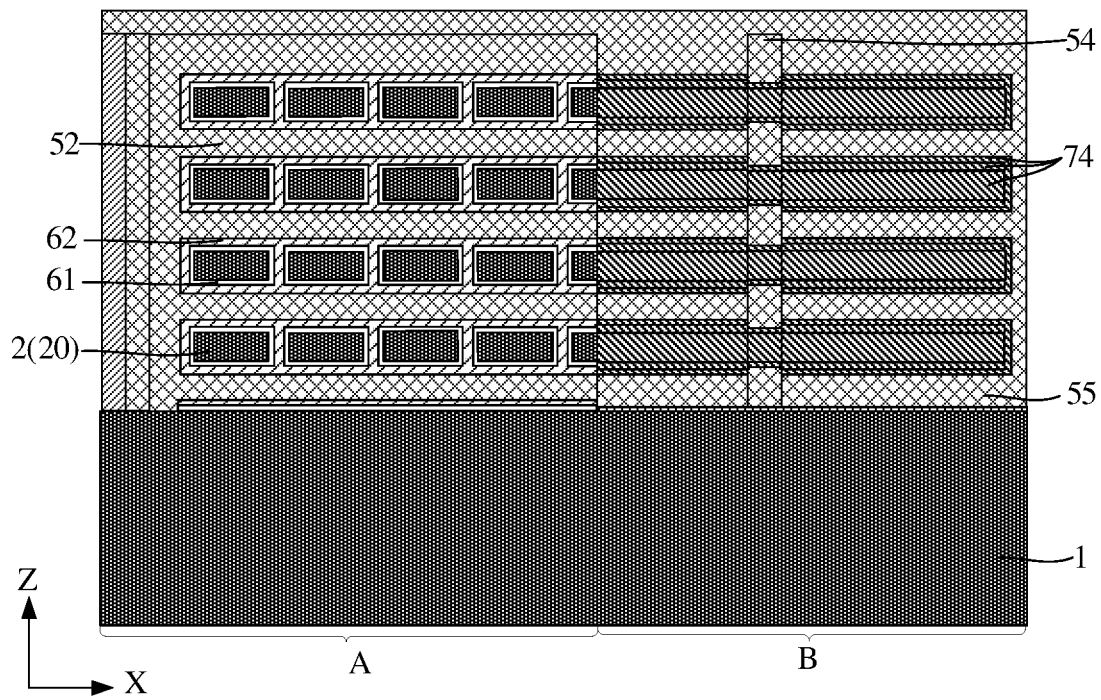

Referring to FIG. 24, a filling layer 55 that wraps the second regions B2 is formed. That is, the filling layer 55 fills upper and lower sides of a part of each of the active layers 20 and covers a sidewall of a part of each of the active layers 20, such that the filling layer 55 surrounds a part of each of the active layers 20 located in the second regions B2. The filling layer 55 can support the part of the active layers 20 in the second regions B2, thereby improving robustness of the part of the active layers 20 and preventing the part of the active layers 20 from collapsing.

Figure 25:
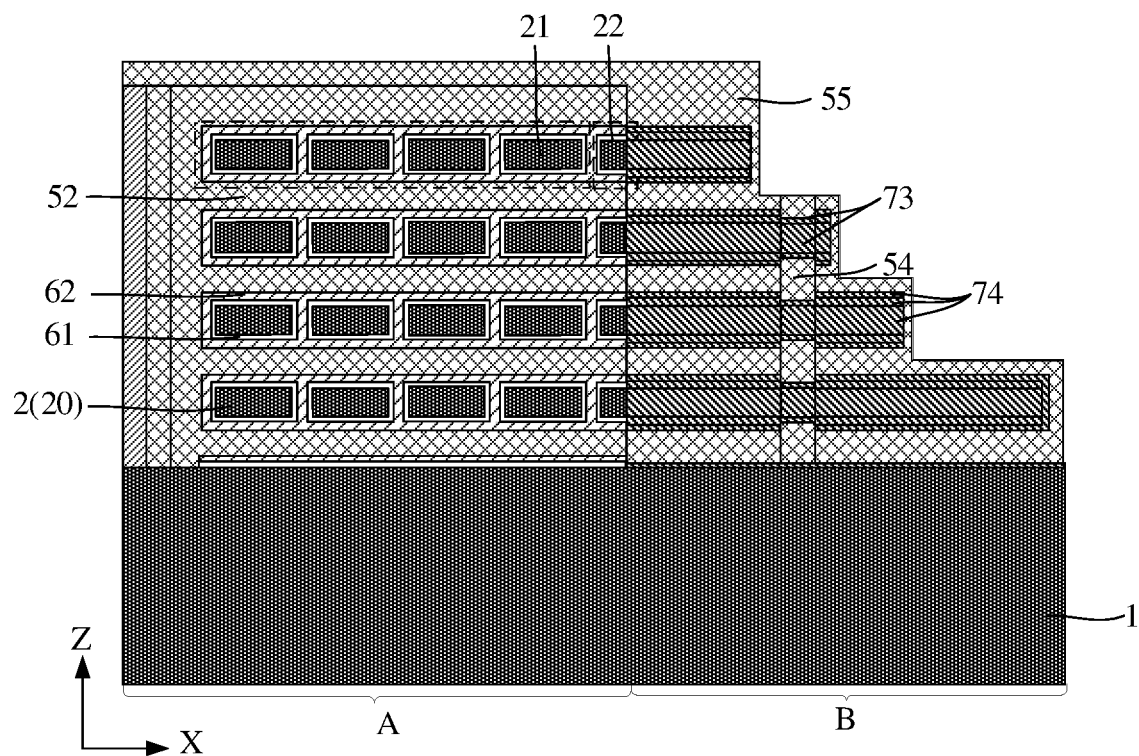

Referring to FIG. 25, the step region B is patterned to form steps. The part of the active layers 20 in the step region B and a partial thickness of the filling layer 55 located on a surface thereof constitute the steps. In other words, each step corresponds to a part of one of the active layers 20 and a partial thickness of the filling layer 55 on each of upper and lower sides of the part of the corresponding active layer 20. In a direction that the word line region A2 points to the step region B, heights of the steps decrease successively.

In addition, at least some of the steps further include a part of the support structure 54 located on the surface of a part of the corresponding active layer 20. In other words, in the patterning process, a partial thickness of the support structure 54 may be removed. For example, a part of the support structure 54 located above a top active layer 20 may be removed, or a part of the support structure 54 located on a second top active layer 20 may also be removed. That is, it is determined, according to a length of the step in the first direction X, whether to remove a part of the support structure 54.

For example, a dry etching process may be used to remove part of the filling layer 55, part of the support structure 54, part of the first metal silicide layer 73, and part of the second metal silicide layer 74 to form the steps.

Figure 26:
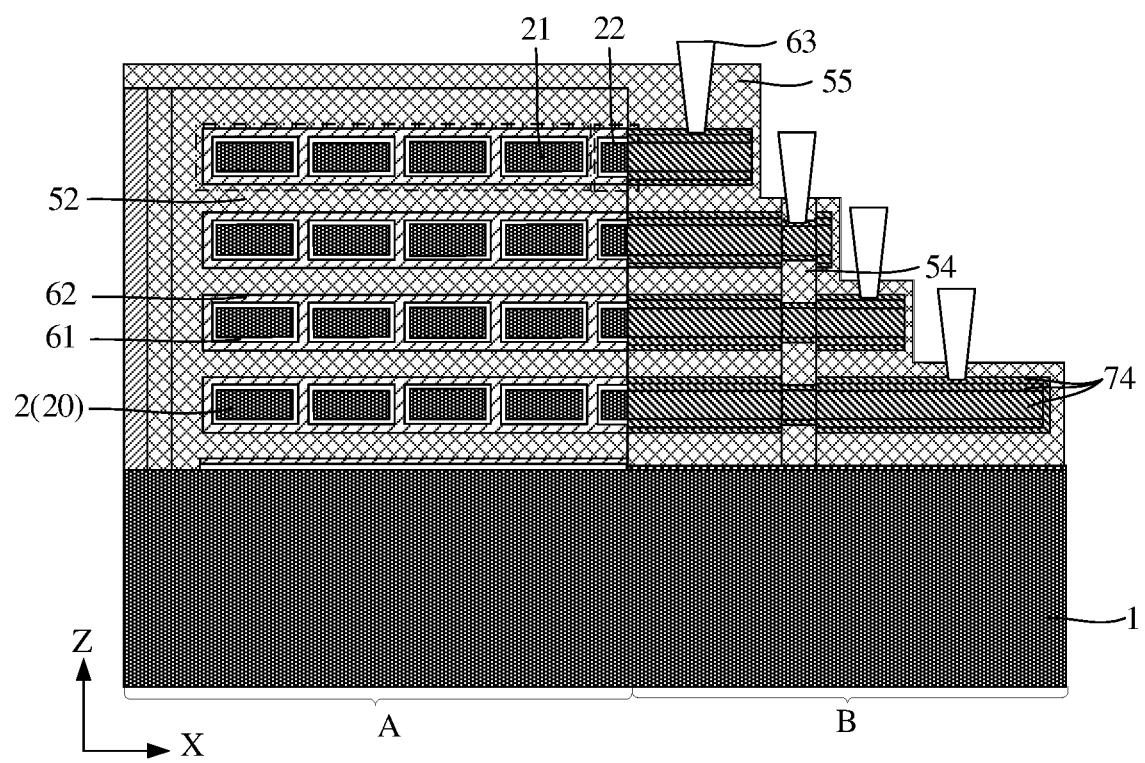

Referring to FIG. 26, a plurality of connecting pillars 63 may be subsequently formed. The connecting pillars 63 are in a one-to-one correspondence with the steps, and each connecting pillar 63 penetrates a part of the filling layer 55 located above a part of the corresponding active layer 20 and is electrically connected to a part of the first metal silicide layer 73 and a part of the second metal silicide layer 74. Each connecting pillar 63 can draw out the corresponding word line 62 for connection to a peripheral circuit.

In addition, a plurality of bit lines that are arranged at intervals may be further formed in the first source-drain region A1. Each bit line extends along the third direction Z and is electrically connected to the plurality of layers of parts of the active structures 2. A capacitor may be further formed in the second source-drain region A3. The capacitor is electrically connected to a part of the active structures 2.

In summary, in the embodiments of the present disclosure, the support structure 54 is formed in the step region B to support the part of the active layers 20, thereby preventing the part of the active layers 20 from collapsing and thus improving a yield of the semiconductor structure. In addition, the first conductorization is performed before the formation of the support structure 54 and the second conductorization is performed after the formation of the support structure 54. The part of the active layers 20 after the first conductorization and the part of the active layers 20 after the second conductorization are electrically connected to the word lines 62 to help draw out the word lines 62.

As shown in FIG. 26, an embodiment of the present disclosure further provides a semiconductor structure. This semiconductor structure can be formed by using the manufacturing method in the foregoing embodiments. The semiconductor structure includes a transistor region A and a step region B arranged in a first direction X, the transistor region A further includes a word line region A2, and the word line region A2 directly faces and is connected to the step region B. The semiconductor structure includes: a base 1, wherein a plurality of active layers 20 that are arranged at intervals are provided on the base 1. The transistor region A includes a plurality of first isolation layers 41 that are arranged at intervals, for dividing a part of the active layers 20 into a plurality of active structures 2, each active structure 2 extends along a second direction Y, and the second direction Y is perpendicular to the first direction X. The word line region A2 includes word lines 62 and dielectric layers 61, each dielectric layer 61 is located on a part of surfaces of a plurality of the active structures 2, each word line 62 is located on a surface of the corresponding dielectric layer 61, and each word line 62 extends along the first direction X. The step region B includes a first region B1 and second regions B2 located on two sides of the first region B1, and the first region B1 extends along the second direction. The first region B1 includes a support structure 54, and the support structure 54 wraps a part of the active layers 20 in the first region B1. The part of the active layers 20 in the step region B is electrically connected to the word lines 62. For detailed description of the semiconductor structure, refer to the foregoing embodiments. Details are not described herein again.

Still referring to FIG. 26, the semiconductor structure further includes a filling layer 55, wrapping a part of the active layers 20 in the second regions B2. That is, the filling layer 55 is used to support the part of the active layers 20 located in the second regions B2.

Still referring to FIG. 26, the step region B includes steps, the part of the active layers 20 in the step region B and a partial thickness of the filling layer 55 located on a surface thereof constitute the steps, and at least some of the steps further include a part of the support structure 54 located on the surface of a part of the corresponding active layer 20; and in a direction that the word line region A2 points to the step region B, heights of the steps decrease successively. The step region B further includes a plurality of connecting pillars 63. The connecting pillars 63 are in a one-to-one correspondence with the steps, and each connecting pillars 63 is electrically connected to a part of the first metal silicide layer 73 and a part of the second metal silicide layer 74. That is, the steps provide spatial locations for the connecting pillars 63, such that each connecting pillar 63 can draw out the corresponding word line 62 for connection to a peripheral circuit.

In the specification, the description of terms such as "an embodiment" or "for example" means that specific features, structures, materials or characteristics described in combination with the embodiment or example are included in at least one embodiment or example of the present disclosure. In this specification, the illustrative expressions of the above terms do not necessarily refer to a same embodiment or example. Furthermore, the specific features, structures, materials, or characteristics described may be combined in a suitable manner in any one or more of embodiments or examples. In addition, those skilled in the art may combine different embodiments or examples described in this specification and characteristics of the different embodiments or examples without mutual contradiction.

Although the embodiments of the present disclosure have been illustrated and described, it may be understood that the foregoing embodiments are examples instead of limitations to the present disclosure. Those of ordinary skill in the art can make various changes, modifications, replacements, and variations on the foregoing embodiments within the scope of the present disclosure. Therefore, any changes or modifications made according to the claims and descriptions of the present disclosure should fall within the scope of the present disclosure.

The invention claimed is:

1. A method of manufacturing a semiconductor structure, wherein the semiconductor structure comprises a transistor region and a step region arranged in a first direction, the transistor region comprises a word line region, the word line region directly faces and is connected to the step region, and the method of manufacturing comprises:
providing a base, and forming sacrificial layers and active layers that are alternately arranged on the base;
forming a plurality of first isolation layers extending along a second direction in the transistor region, wherein the second direction is perpendicular to the first direction; and each first isolation layer of the plurality of first isolation layers is located in the sacrificial layers and the active layers, and the plurality of first isolation layers divide a part of the active layers into a plurality of active structures;
removing a part of the first isolation layers in the word line region and a part of the sacrificial layers in the word line region;
forming a plurality of word lines in the word line region and forming a plurality of dielectric layers in the word line region, wherein each dielectric layer of the plurality of dielectric layers is located on a part of surfaces of the plurality of active structures, each word line of the plurality of word lines is located on a surface of a corresponding dielectric layer, and each of the plurality of word lines extends along the first direction; and
the step region comprises a first region and a second regions-region located on two sides of the first region, and the first region extends along the second direction;
removing a part of the sacrificial layers in the first region;
performing a first conductorization on a part of the active layers in the first region;
forming a support structure wrapping the part of the active layers in the first region after the first conductorization;
removing a part of the sacrificial layers in the second region after the forming a support structure; and
performing a second conductorization on a part of the active layers in the second region, wherein the part of the active layers in the first region after the first conductorization and the part of the active layers in the second region after the second conductorization are electrically connected to the plurality of word lines.

2. The method of manufacturing a semiconductor structure according to claim 1, wherein the first conductorization comprises:
forming a first metal layer on a surface of the part of the active layers in the first region, wherein the first metal layer further covers a sidewall of the part of the sacrificial layers in the second region facing the first region;

performing a first heat treatment, such that the first metal layer reacts with the part of the active layers in the first region, to generate a first metal silicide layer; and removing an unreacted part of the first metal layer after the first heat treatment.

3. The method of manufacturing a semiconductor structure according to claim 1, wherein the second conductorization comprises:

forming a second metal layer on a surface of the part of the active layers in the second region, wherein the second metal layer further covers a surface of the support structure;

performing a second heat treatment, such that the second metal layer reacts with the part of the active layers in the second region, to generate a second metal silicide layer; and removing an unreacted part of the second metal layer after the second heat treatment.

4. The method of manufacturing a semiconductor structure according to claim 1, after the removing a part of the sacrificial layers in the second region, the method further comprises: forming a thickened layer on a surface of the part of the active layers in the second region; and performing the second conductorization on the thickened layer.

5. The method of manufacturing a semiconductor structure according to claim 4, wherein each word line of the plurality of word lines has a first thickness, the thickened layer has a second thickness, and a ratio of the first thickness to the second thickness is 4:1 to 1:1.

6. The method of manufacturing a semiconductor structure according to claim 4, wherein a method of forming the thickened layer comprises an epitaxial growth process.

7. The method of manufacturing a semiconductor structure according to claim 1, wherein the transistor region further comprises a first source-drain region and a second source-drain region, the first source-drain region, the word line region, and the second source-drain region are arranged in sequence in the second direction; and before the forming a plurality of dielectric layers, the method further comprises:

forming a third isolation layer, wherein the third isolation layer is located on two opposite sides of the word line region and covers a sidewall of a part of the sacrificial layers in the first source-drain region and a sidewall of a part of the sacrificial layers in the second source-drain region and a partial surface of each of the plurality of active structures.

8. The method of manufacturing a semiconductor structure according to claim 1, wherein a part of each active layer of the plurality of active structures in the word line region comprises a first active structure and a second active structure, the first active structure is located on a side of the word line region away from the step region, the second active structure is located on a side of the word line region close to the step region, and the second active structure is connected to a part of a corresponding active layer in the step region; and the forming a plurality of word lines and the forming a plurality of dielectric layers comprise:

forming an initial dielectric layer, wherein the initial dielectric layer covers a surface of the first active structures and further covers a top surface, a bottom surface, and a side face that faces a corresponding first active structure of the second active structures and a sidewall of the word line region facing the step region;

forming an initial word line, wherein the initial word line wraps the first active structures and is further located on the top surface, the bottom surface, and the side face that faces the corresponding first active structure of the second active structures and the sidewall of the word line region facing the step region, and the initial word line further covers the initial dielectric layer; and after the removing a part of the sacrificial layers in the second region, removing a part of the initial dielectric layer located on the sidewall of the word line region facing the step region and a part of the initial word line located on the sidewall of the word line region facing the step region, and a remaining part of the initial dielectric layer as the plurality of dielectric layers and a remaining part of the initial word line as the plurality of word lines.

9. The method of manufacturing a semiconductor structure according to claim 1, before the removing a part of the sacrificial layers in the first region, the method further comprises: forming a protective layer located on a sidewall of the step region.

* * * * *